United States Patent [19]

Beauducel et al.

[11] Patent Number: 4,779,055

[45] Date of Patent: Oct. 18, 1988

[54] DEVICE FOR AMPLIFYING AND SAMPLING HIGH DYNAMIC SIGNALS

[75] Inventors: Claude Beauducel, Henonville; Pierre Fouquet, Argenteuil, both of France

[73] Assignee: Institut Francais du Petrole, Malmaison, France

[21] Appl. No.: 3,015

[22] Filed: Jan. 13, 1987

[30] Foreign Application Priority Data

Jan. 14, 1986 [FR] France ................ 85 19100

[51] Int. Cl.$^4$ ............................................ H03G 3/20
[52] U.S. Cl. ........................................ 330/51; 330/86; 330/129; 330/151; 330/278; 330/282; 367/67
[58] Field of Search .................. 330/51, 86, 127, 129, 330/151, 278, 279, 282; 367/65, 66, 67

[56] References Cited

U.S. PATENT DOCUMENTS 4,378,527 3/1983 Beauducel et al. ................ 330/86
4,426,624 1/1984 Beauducel et al. ............ 330/282 X Primary Examiner—James B. Mullins
Attorney, Agent, or Firm—Antonelli, Terry & Wands

[57] ABSTRACT

A device is provided for amplifying and sampling signals in an acquisition chain before application thereof to an analog-digital converter and in particular multiplexed signals. It includes two blocking samplers to which a gain of 1, 2 or 16 for the first one and a gain of 2 or 16 for the second one may be applied by selective closure of switches. A switch allows either the input signal or the signal from the second sampler to be applied to the first sampler. Another switch allows the outputs of one or other of the samplers to be connected to the input of a voltage comparator. By a very limited number of comparison steps, gain modifications and possible relooping of the output to the input of the device for one or more reamplifications, an input signal may be given any gain between $2^0$ and $2^{13}$.

4 Claims, 5 Drawing Sheets

DEVICE FOR AMPLIFYING AND SAMPLING HIGH DYNAMIC SIGNALS

BACKGROUND OF THE INVENTION

1. Field of the Invention

The invention relates to a new device for amplifying and sampling high dynamic signals.

The device of the invention is adapted in particular to the amplification and sampling of signals in a signal acquisition chain, before digitization thereof in an analog-digital converter and recording thereof, and in particular to the amplification of seismic signals.

Seismic prospection methods generally include the transmission of waves by a seismic source, reception of the waves reflected back by the different reflecting interfaces of the subsoil and the formation of seismic recordings representative of the configuration of the subsoil. The waves are received by reception devices having a very large number of sensors spaced apart along the seismic profile to be studied. For seismic prospection at sea, the sensors, are distributed all along and inside a flexible sealed sheath of great length which is called a streamer.

2. Description of the Prior Art

In recent streamers, the assembly of sensors is divided into a plurality of subassemblies. The signals picked up by the sensors of the same subassembly are connected by an electronic data acquisition apparatus which digitizes them and records them. After each transmission-reception cycle, the signals recorded by the different apparatus of the streamer are transmitted to a central control and recording laboratory through a multiplexed transmission system. This includes several transmission lines to which the different apparatus are connected intermittently and sequentially, under the control of the central laboratory. Such a transmission system is described for example in the French Pat. No. 2.471.088.

So as to obtain an ever higher power of resolution, seismic streamers are developed which are longer and longer, containing an increased number of seismic sensors and consequently the number and complexity of the acquisition apparatuses used for collecting all the signals received are correspondingly increased. Acquisition apparatus are disposed generally in sealed boxes inserted between sections of the streamer, these boxes being connected to the central laboratory by data transmission lines, order and test signal transmission lines and also electric power supply lines.

Increase in the collecting capacity of the acquisition apparatus leads to increasing accordingly the number of their electronic modules. This results in an increase in the volume of the inserted boxes and of their weight, and also in a considerable increase in the electric energy consumed. It is then desirable to use acquisition apparatus whose different electronic modules are optimized for reconciling at one and the same time performance, reliability and a relatively low electric consumption. This is true particularly for the amplification chains adapted for bringing the amplitude of the signals received by the seismic sensors to a sufficient level for application to an analog to digital converter.

Amplifier arrangements are known in which the signals received are applied to the inputs of an analog multiplexer disposed at the head of the acquisition chain after previous application in a fixed gain preamplifier. The output of the multiplexer is connected to a single amplifier formed by a chain of amplifier elements disposed in series, the output of each of them being connected to the input of the next one. The gain of each amplifier element is fixed and chosen preferably equal to a whole power of the number 2.

Since the variation in amplitude between any two successive samples may be very large, a selection member chooses the number of amplification units which each signal must pass through so as to reach an optimum level and switches the output of the amplifier element where this signal is available to the input of an analog to digital converter, which is connected to a recording system. In a first variant, described for example in the French Pat. No. 2.110.758, all the amplification elements have an identical gain. In a second variant, the gains of the different amplifier elements of the chain are different from each other and their values are chosen from the successive powers of the number 2. One embodiment is described in the French patent application No. 2.373.914 which relates to an amplifier formed by n stages, the value of the gain of any one amplification stage being equal to the square of the value of the gain of the preceding amplification stage.

Successive samples delivered by the head multiplexer are stored in a sample-and-hold unit (hereafter S & H unit) disposed upstream of the amplification stage and which thus operates on high dynamic signals. It is known, that such an arrangement has a drawback: the S & H units currently used introduce diaphony between successive samples. Errors which result therefrom are amplified with a gain equal to the maximum gain of the amplification chain. Furthermore, buffer amplifiers generally included in S & H units further increase the number of amplification stages.

The device of the invention allows high dynamic signals coming from a multiplexer to be amplified and sampled, while avoiding the above mentioned drawbacks.

SUMMARY OF THE INVENTION

The device of the invention includes a first and second amplification and sampling means, each of them being associated with a feed-back network and able to take on selectively several different gain values, a voltage comparator means for comparing signals issued from the amplification and sampling means with threshold voltages, commutation means for applying signals issued from the amplification and sampling means to said voltage comparator means and changing the gain of said amplification and sampling means, and means for selecting the commutation means.

The amplification and sampling units include two sample-and-hold units disposed in series, the output of the first one being connected permanently to the input of the second, said sample and hold units being able to take on several predetermined gain values by selective closure of said commutation means under the control of said selection means, said commutation means comprising a first switching element for selectively connecting to the input of the first sample and hold units, either the voltage issued from the multiplexer or the voltage from the second sample and hold unit.

The feedback networks are chosen preferably so as to give to the first sample and hold unit an amplification gain of 1, 2 or 16 and to the second an amplification gain of 2 or 16.

The device of the invention has numerous advantages: two units interconnected in series are sufficient for providing all the blocking, sampling and amplification functions. Each of them is able to take on a very limited number of different gain values (two or three in practice) and consequently the feedback networks required for obtaining them are reduced. It is then a simple and reliable structure, with relatively low electric consumption which however allows, by a limited number of gain adjustment steps and successive reamplifications, a very extensive amplification dynamic to be obtained. Such a device is well adapted in particular to the construction of seismic streamers of very great length.

Furthermore, the dynamics of the signals stored successively by each sample and hold (S & H) unit is much smaller than in the case where this function is fulfilled by a single element disposed at the head and consequently the parasite effects of diaphony between the samples are minimized.

BRIEF DESCRIPTION OF THE DRAWINGS

Other features and advantages of the device will be clear from reading the following description of one embodiment given by way of non limitative example, with reference to the accompanying drawings in which.

DESCRIPTION OF THE PREFERRED EMBODIMENTS

Figure 1:
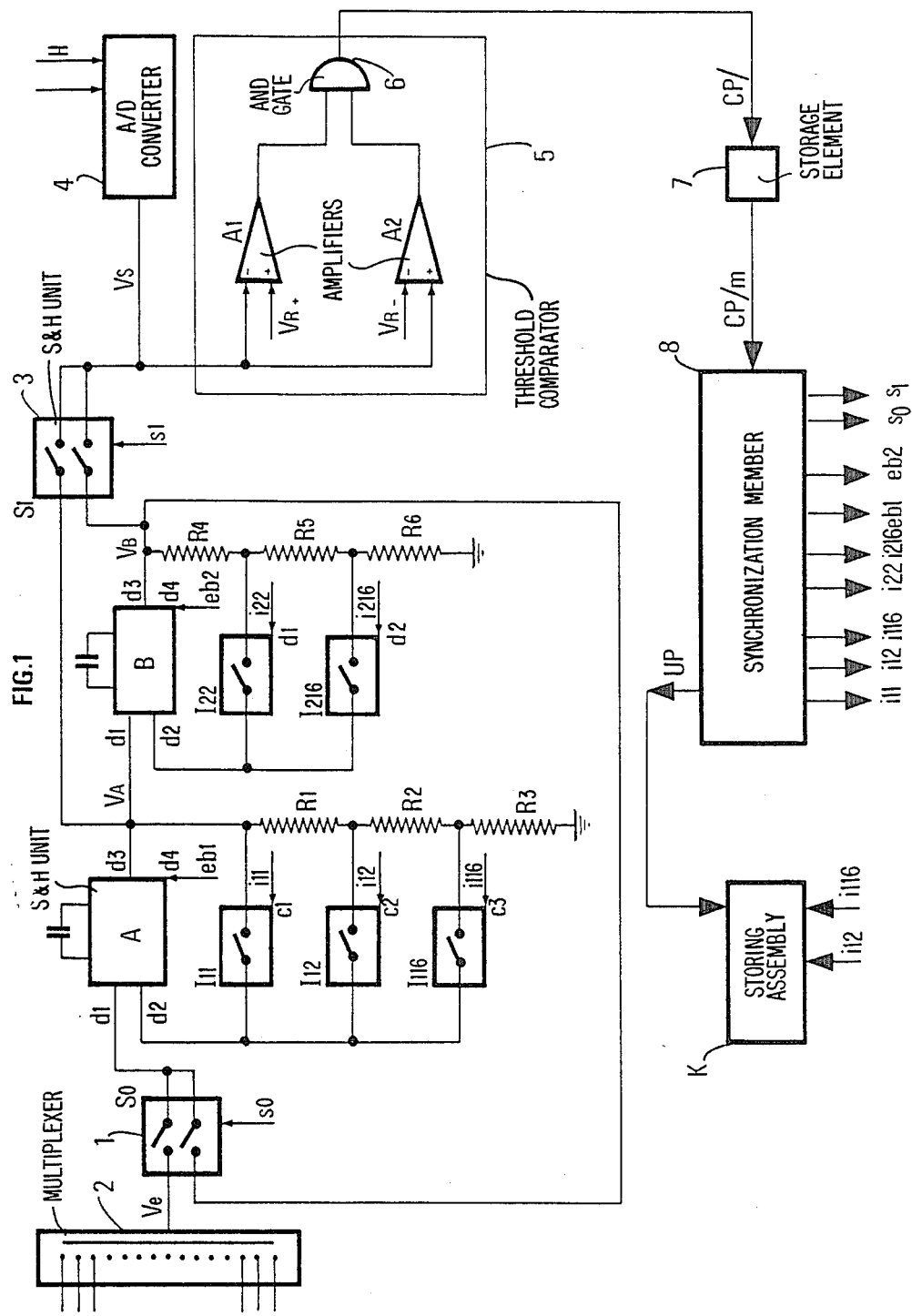
FIG. 1 shows the block diagram of the device.

The device includes (FIG. 1) a first electronic two-way switch $S_0(1)$. A first input of switch $S_0$ receives from a multiplexer 2 a signal sample $V_e$ to be amplified. The two outputs of switch $S_0$ are connected to a first input $D_1$ (non inverted input) of a S & H unit A. The output $d_3$ thereof is connected to ground through three resistors $R_1,R_2,R_3$ connected in series. A second input $D_2$ (inverting input) of the blocking sampler A is connected directly to the output $D_3$ through a first electronic switch $I_{11}$ of a known type, to the interconnection point between resistors $R_1$ and $R_2$ through a second electronic switch $I_{12}$ and to the interconnection point between resistors $R_2$ and $R_3$ through a third switch $I_{116}$. To a control input $D_4$ of the S & H unit A is applied a signal for alternately sampling and storing the signal applied to the input. The switches $I_{11}$, $I_{12}$ or $I_{116}$ are each provided with a control input $C_1$, $C_2$,$C_3$ and are closed respectively by application thereto of signals $i_{11}$, $i_{12}$,$i_{116}$. Three resistors $R_1,R_2,R_3$ and the three switches $I_{11},I_{12},I_{116}$ form a conventional feedback network. The values of the resistors are chosen so that the selective closure of switches $I_{11}$, $I_{12},I_{116}$ give to the S & H unit A either a unit gain, or a gain of 2, or a gain of 16. The S & H unit A with its feedback network and switches $I_{11},I_{12}$ $I_{116}$ form the first amplification and sampling means.

The output $d_3$ of the S & H unit A is connected to a first input $d_1$ (non inverter) of a second S & H unit B. The output $d_3$ there of is also connected to ground through three resistors $R_4,R_5,R_6$ connected in series. A second (inverting) input $b_2$ of the S & H unit B is connected to the interconnection point between resistors $R_4,R_5$ through a fourth switch $I_{22}$ and to the interconnection points between resistors $R_5,R_6$ through a fifth switch $I_{216}$. The switches $I_{22},I_{216}$ are also provided with a control input $d_1$, $d_2$ and are closed respectively by application thereto of signals $i_{22},i_{216}$. Similarly, the S & H unit B comprises an input $d_4$ for the application of a control signal $e_{b2}$. The three resistors $R_4,R_5,R_6$ and the two switches $I_{22},I_{216}$ also form a conventional feedback network. The values of the three resistors are chosen so that closure of switch $I_{22}$ or of switch $I_{216}$ gives to the S & H unit B a gain equal to 2 or a gain equal to 16. The S & H unit B, the feedback network and the associated switches $I_{22}$, $I_{216}$ form the second amplification and sampling means The output $d_3$ of the second S & H unit B is connected to the second input of the switch $S_0(1)$. The respective outputs of the two S & H units A, B are connected to the two inputs of a two-way switch $S_1(3)$. The interconnected outputs of switch $S_1$ form the output of the device. Signal $V_s$ which is available there is applied to an analog to digital converter 4 of a known type.

Switches $S_0$ and $S_1$ are provided with a control input. Closure thereof is provided by the selected application thereto of control signals $S_0,S_1$.

The signal $V_s$ available at the output of the device is applied to the input of a threshold switch 5. It is compared with two symmetrical reference voltages $V_{R+}V_{R-}$, one positive the other negative, by two comparison amplifiers $A_1,A_2$ whose outputs are connected to the respective inputs of a two input AND gate 6. By CP/ is designated the signal available at the output of the AND gate 6. Depending on whether the absolute value of the amplitude of the output signal $V_S$ is less than the threshold voltage $V_{R+}$ or greater, the signal CP/ will be equal to 1 or 0. The signal CP/ from the threshold comparator 5 is applied to storage element 7. The stored values CP/M of the signal CP/ are used by a synchronization member 8 which elaborates the different control signals. Different signals generated by the synchronization member 8 are applied to an assembly K storing the gain values, as will be seen in detail further on.

Figure 2:
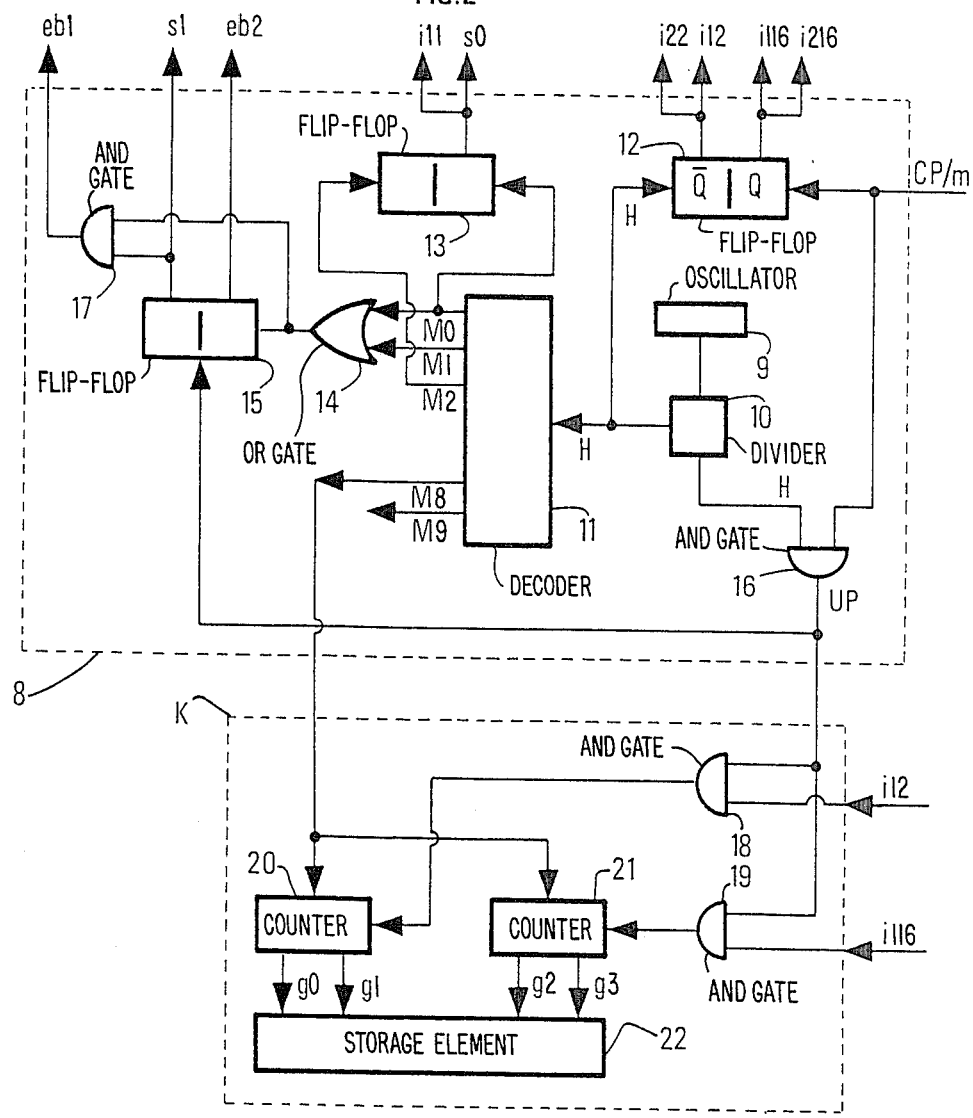
FIG. 2 shows schematically the synchronization means which coordinate the operation of the device.

The synchronization member 8 includes (FIG. 2) an oscillator 9 generating a reference signal whose frequency is divided by a given factor, in a divider element 10. The clock signal H generated by divider 10 is applied on the one hand to a decoder 11 which delivers at ten outputs signals $M_0$ to $M_9$ defining ten successive times separated by intervals equal to the period of the clock signal H. It is also applied to a first input of a flip flop 12 whose other input receives the signal CP/m from the storage element 7. At the Q output of flip flop 12 are available two signals $i_{116}$, $i_{216}$ which are respectively applied to the control inputs of switches $I_{116}$, $I_{216}$ (FIG. 1). At the complementary $\overline{Q}$ output of flip flop 12 are available two signals $i_{12}$, $i_{22}$ which form the respective control signals of switches $I_{12}$, $I_{22}$ (FIG. 1).

The signals $M_0$ and $M_2$ are applied respectively to two inputs of a second flip flop 13. At the Q output thereof is available a signal used both as control signal $S_0$ for switch $S_0$ and as control signal $i_{11}$ for switch $I_{11}$ of the S & H unit A (FIG. 1).

The two successive signals $M_0, M_1$ from the decoder 11 are applied through an OR gate 14 to a first input of a third flip flop 15. This latter receives at its "clock" input the signal UP delivered by an AND gate 16 with two inputs, which inputs receive respectively the clock signal H from the divider element 10 and the stored signal CP/m. At a first output terminal of flip flop 15 is available a signal $s_1$ used for controlling the switch $S_1$ (FIG. 1). The signal $eb_2$ available at the complementary output terminal is applied to the input $d_4$ of the S & H unit B (FIG. 1) as well as to a first input of an AND gate 17. At a second input thereof is applied the signal from the OR gate 14. At its output is available a signal $eb_1$ which is used for controlling the S & H unit A (FIG. 1) at its input $d_4$.

The signals, $i_{12}, I_{116}$ delivered by flip flop 12 are also applied respectively to a first input of two AND gates 18, 19. To a second input thereof is applied the signal UP delivered by gate 16. The outputs of the two AND gates 18, 19 are connected to the counting inputs of two counters 20, 21. The control input of these two counters is connected to the output of decoder 11 where the signal $M_8$ is available. Application of this signal inhibits the counting. The outputs $g_0, g_1, g_2, g_3$ of these two counters are connected to the inputs of an element 22 storing the gain. The gain values frozen in counters 20, 21 at the end of each amplification and sampling cycle, when the signal to be amplified has reached an optimum level, are thus stored. The gates 18, 19, the counters 20, 21 and the storage element 22 form the gain storage assembly 9.

Figure 3:
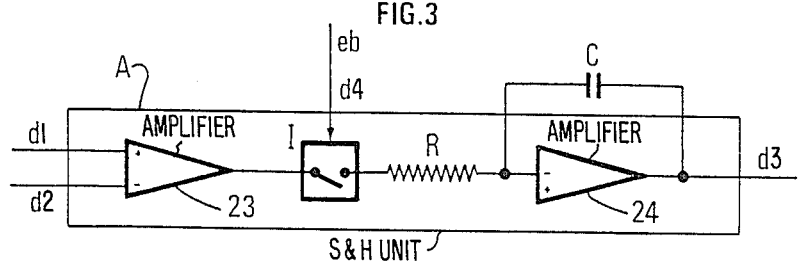
FIG. 3 shows schematically the arrangement of a sample and hold unit which may be used for constructing the device.

The S & H units A and B are identical. Each of them comprises (FIG. 3) two differential amplifiers 23, 24. The first one 23 is connected in an open loop, the second 24 is an integrator by means of a resistor R and a capacitor C as is well known. The output of the first one is connected to the input of the second through a switch I which is actuated by application to the terminal $d_4$ of a signal eb coming from the synchronization member 8. The terminals $d_1$ and $d_3$ represent respectively the input and the output of the S & H unit. The feedback network associated with each S & H units A or B (FIG. 1) is connected between the output of the second amplifier 24 and the inverting input $d_2$ of the first amplifier. The S & H units used are in the form of integrated circuits.

Figure 4:
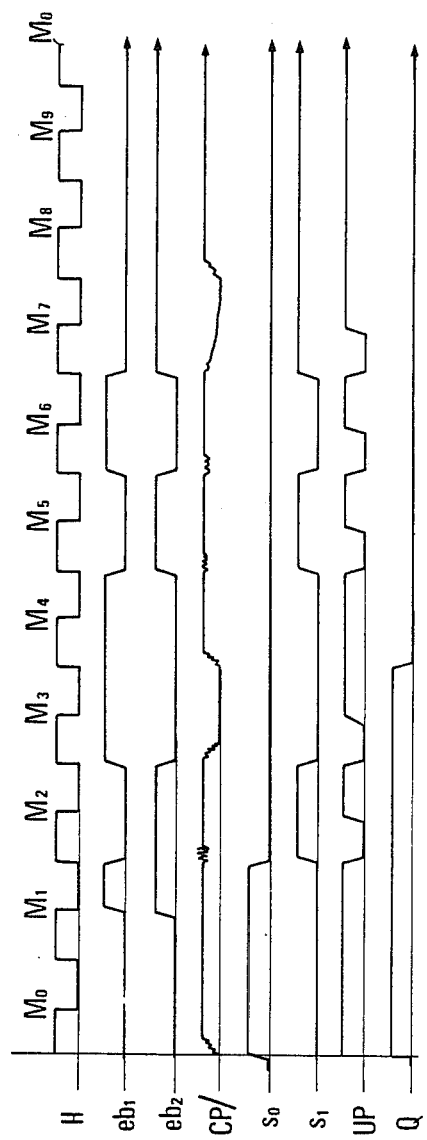
FIGS. 4 and 5 show by way of example the timing diagrams of the different control signals of the device, during two amplification and sampling cycles of very unequal durations for applying to an input signal, in the first case a gain of $2^{11}$ and in the other of $2^{12}$.
Figure 5:
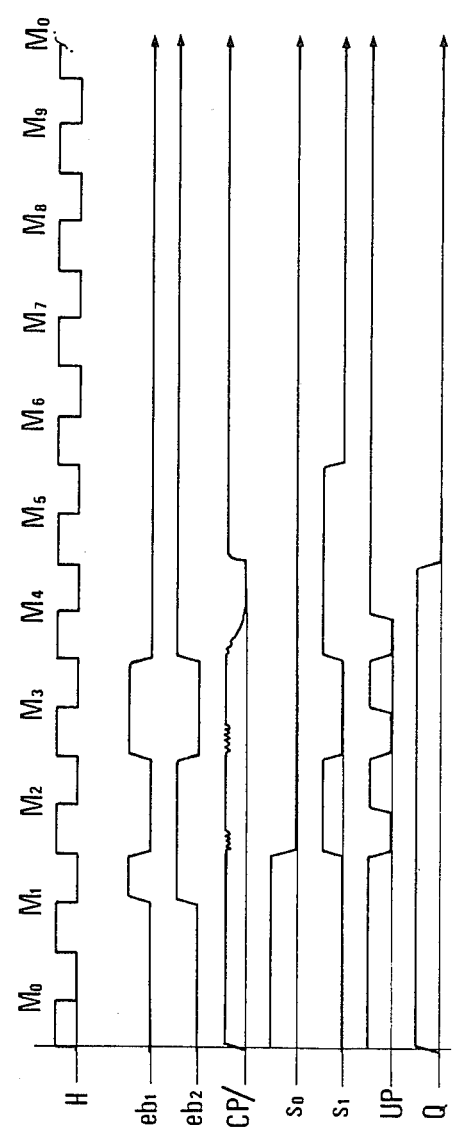

The operation of the amplification and sampling device is explained in detail by the selection diagrams of FIGS. 4, 5. Each amplification cycle includes:

an initial sampling step $E_0$ in which the synchronisation member:

(a) actuates the switches $S_0$ and $S_1$ so that the signal $V_e$ from the multiplexer is applied to the input of the S & H unit A and so that from the second one B is applied to the comparator 5;

(b) Controls the application of a gain of 1 and of a gain of 16 respectively to the S & H units A and B;

(c) actuates the switches I so that they store in their respective capacitors C the value of the amplified signals; and then:

several successive steps of comparing the voltage at the outputs of the two S & H units A, B with the threshold values, for possibly modifying the gains and, if the amplification level reached is not sufficient, relooping from the output of the second sampler to the input of the first one so as to apply to the signals a new amplification.

Figure 6:
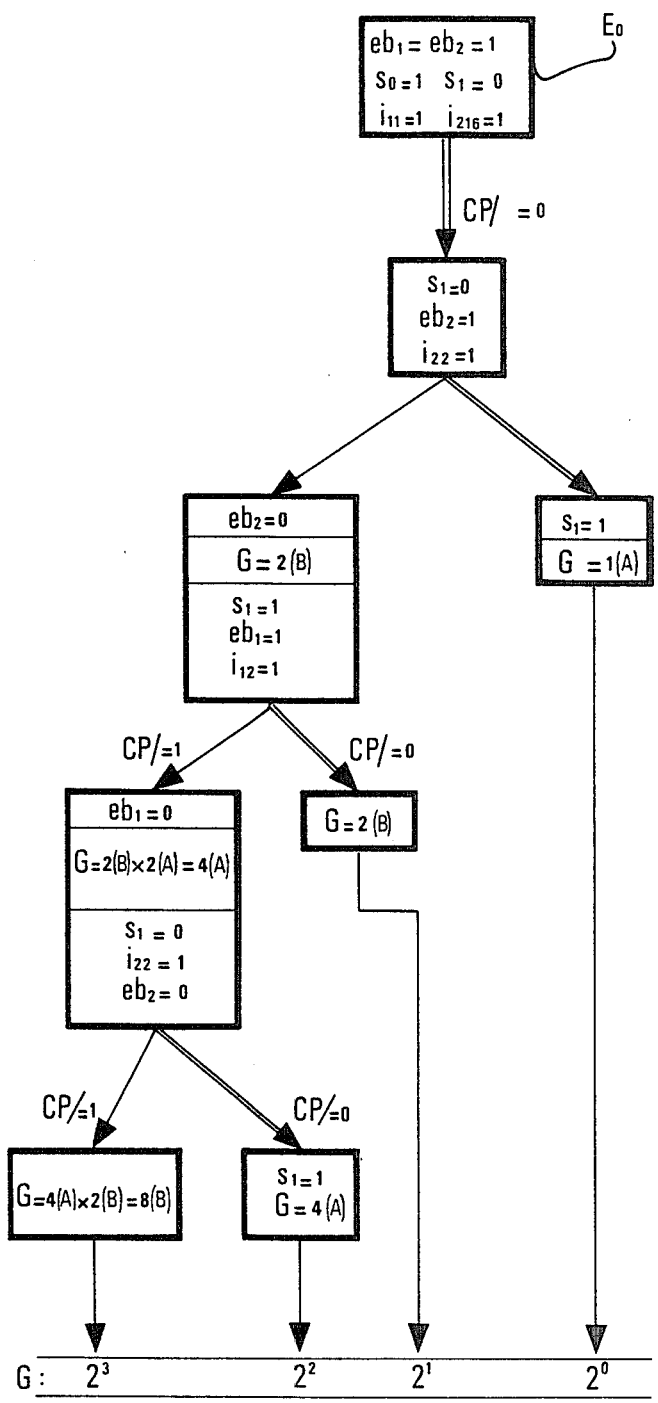
FIG. 6 shows a part of the selection diagram for applying to an input signal a gain at most equal to $2^3$.

If the signal from the second S & H unit is higher than the threshold value and if consequently the signal CP/ takes on the logic value 0, the selection cycle continues in the way indicated by the diagram of FIG. 6. In the opposite case it is that of FIG. 7 which describes the rest of the selection cycle.

For the sake of simplicity, the diagrams have been drawn using the following conventions:

(a) when the signal $S_0$ has a value a logic 1, that means that the signal $V_e$ at the input of the device is applied to the input $d_1$ of the first S & H unit A. If its logic value is 0, it is the signal $V_b$ at the output of the second one B which is applied by relooping to this same input $d_1$.

(b) the logic value 1 attributed to signal $s_1$ means that the signal $V_A$ from the first S & H unit A is applied to the input of comparator 5. If the signal $s_1$ has a logic 0 as value, it is the signal $V_B$ at the output of the second one B which is applied to the comparator 5.

(c) assigning the logic value 1 to the signals $i_{11}, i_{12}, i_{11-6}, i_{22}, i_{216}, eb_1$ and $eb_2$ means that the switches $I_{11}, I_{12}, I_{11-6}, I_{22}, I_{216}$ and the switches I (cf. FIG. 3) are closed. The value 0 assigned to these same signals means, by convention, that they are open.

(d) when a value of the gain G is followed by the letter A or B in brackets that means that the amplified signal to which this gain is assigned is available at the output of the corresponding S & H unit. When it is expressed in the form of a product of two numbers, one followed by the letter A, the other by the letter B, that means that the overall gain results from the contributions of the two S & H units, the first partial gain being that which assigns the amplified signal to the output of the first one (A), the second partial gain, that which assigns the signal to the output of the second one (B).

Figure 7:
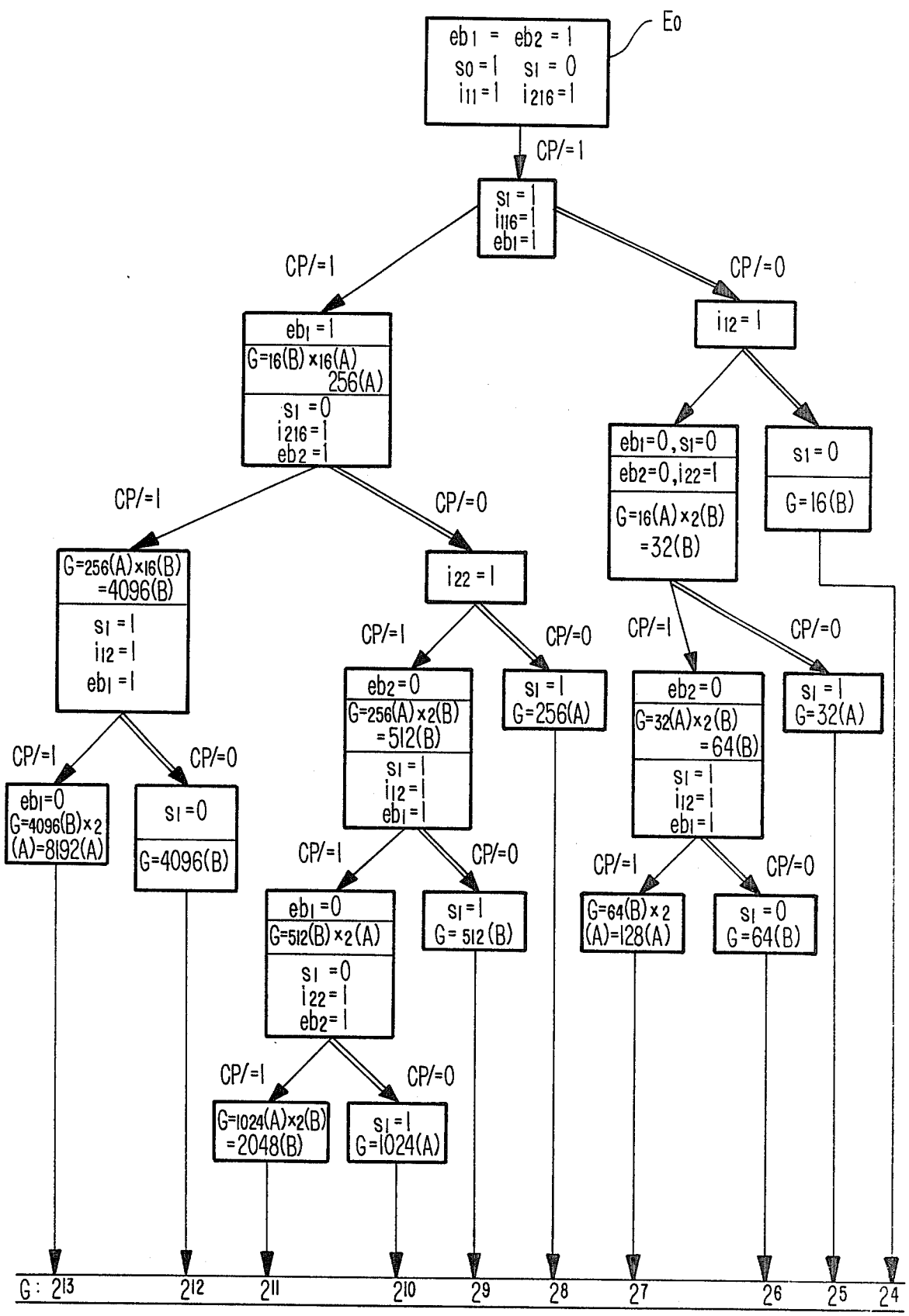
FIG. 7 shows the complementary part of the selection diagram, for applying to an input signal a gain between $2^4$ and $2^{13}$.

It can be seen from the two diagrams of FIGS. 6 and 7 that, depending on the level of the signal $V_e$ from the multiplexer, the sampling and amplification cycle includes, after the initial step $E_0$, from two to six additional steps.

In the timing diagrams of FIG. 4, it can be seen for example that the total gain of $2^{11}$ is reached at time $M_8$ of the cycle by application to the input signal by one or other of the S & H units of twice a gain of sixteen and three times a gain of two. The timing diagrams of FIG. 6 also show for example that a gain of $2^{12}$ may also be applied to the input signal by amplifying it with a gain of 16, once in the blocking sampler A and twice with the same gain in the second one, the optimum level being reached at time $M_5$ of the cycle.

After each cycle of a duration equal to ten periods of the clock signal H, a new cycle begins again for another signal sample $V_e$ applied to the input.

What is claimed is:

1. A device for amplifying and sampling high dynamic signals, issued from a multiplexer, comprising:

first and second amplification and sampling means, each associated with a respective feedback network and being capable of taking on selectively several different gain values through control of said feedback network;

voltage comparator means for comparing signals issuing from said first and second amplification and sampling means to predetermined threshold voltages;

commutation means for selectively applying signals which issue from said first and second amplification and sampling means to said voltage comparator means and for selectively controlling said feedback network for changing the gain of said first and second amplification and sampling means; and selecting means for selectively controlling said commutation means depending on a signal issuing from said voltage comparator means;

said first and second amplification and sampling means including respective sample and hold units disposed in series, the output of a first sample and hold unit being connected permanently to the input of a second sample and hold unit, a respective one of said feedback networks being connected to each of said sample and hold units for providing several predetermined gain values in response to selective closure of said commutation means under the control of said selection means;

said commutation means comprising first switching means for selectively connecting to the input of the voltage comparator means either a voltage issued from the first sample and hold unit or a voltage issued from the second sample and hold unit and second switching means for selectively connecting to the input of the first sample and hold unit either a voltage issued from the multiplexer or a voltage from the second sample and hold unit.

2. The device as claimed in claim 1, wherein the feedback network associated with said first sample and hold means provides an amplification gain of 1, 2 or 16 and the feedback network associated with the second sample and hold means provides an amplification gain of 2 or 16.

3. The device as claimed in claim 2, wherein the commutation means comprises third switching means having switching elements associated with said feedback networks for changing the gain of said amplification and sampling units; the selection means includes means for generating a clock signal, decoder means for generating signals defining successive times within an amplification cycle, a first bistable flip-flop actuated by said clock signal and the signal from said voltage comparator means for generating control signals for said switching elements associated with said feedback networks, a second bistable flip-flop actuated by two signals from the decoder and defining two successive times in said amplification cycle for generating a control signal for said second switching means and for a switching element of said feedback network associated with the first sample and hold unit, a third bistable flip-flop actuated either by two signals from said decoder which represent the first two consecutive times of said amplification cycle or by a signal derived from said clock signal and from the signal coming from said voltage comparator for generating a signal for controlling said first switching means, a signal for controlling the second sample and hold unit and a signal conditioned by said two signals from said decoder which defines the first two consecutive times of said amplification cycle, for controlling the first sample and hold unit.

4. The device as claimed in claim 3, wherein said selection means includes means for storing a value of amplification gain at the end of each amplification cycle, including plural counters for counting signals from the first bistable flip-flop, the enabling input of said counter being connected to an output of said decoder, the outputs of said counters being connected to a storing element for storing a signal representing the value of the amplification gain.

* * * * *